(12) United States Patent
Nogami et al.

(10) Patent No.: US 9,034,721 B2
(45) Date of Patent: May 19, 2015

(54) METHOD FOR MANUFACTURING SEMICONDUCTOR SUBSTRATE

(71) Applicants: SUMCO CORPORATION, Tokyo (JP); DENSO CORPORATION, Kariya, Aichi-ken (JP)

(72) Inventors: Syouji Nogami, Tokyo (JP); Tomonori Yamaoka, Tokyo (JP); Shoichi Yamauchi, Kariya (JP); Nobuhiro Tsuji, Kariya (JP); Toshiyuki Morishita, Kariya (JP)

(73) Assignees: SUMCO CORPORATION, Tokyo (JP); DENSO CORPORATION, Aichi (JP)

( * ) Notice: Subject to any disclaimer, the term of this patent is extended or adjusted under 35 U.S.C. 154(b) by 0 days.

(21) Appl. No.: 14/448,347

(22) Filed: Jul. 31, 2014

(65) Prior Publication Data

US 2014/0342525 A1 Nov. 20, 2014

Related U.S. Application Data

(62) Division of application No. 12/964,141, filed on Dec. 9, 2010, now Pat. No. 8,835,276, which is a division of application No. 12/089,497, filed as application No. PCT/JP2006/319933 on Oct. 5, 2006.

(30) Foreign Application Priority Data

Oct. 6, 2005 (JP) .................. 2005-293087
Aug. 7, 2006 (JP) .................. 2006-214551

(51) Int. Cl.
*H01L 21/306* (2006.01)
*H01L 23/544* (2006.01)
(Continued)

(52) U.S. Cl.
CPC ..... *H01L 21/30604* (2013.01); *H01L 21/02532* (2013.01); *H01L 21/0262* (2013.01);
(Continued)

(58) Field of Classification Search
CPC .................... H01L 23/544; H01L 2223/54426
See application file for complete search history.

(56) References Cited

U.S. PATENT DOCUMENTS

| 4,528,047 A | 7/1985 | Beyer et al. |
| 4,636,281 A | 1/1987 | Buiguez et al. |
| (Continued) | | |

FOREIGN PATENT DOCUMENTS

| DE | 10202140 | 8/2003 |
| JP | 61-16546 | 1/1986 |
| (Continued) | | |

OTHER PUBLICATIONS

Germany Office action dated Nov. 16, 2011, along with an english translation thereof.
(Continued)

*Primary Examiner* — Bac Au
(74) *Attorney, Agent, or Firm* — Greenblum & Bernstein, P.L.C.

(57) ABSTRACT

A semiconductor substrate is provided in which an alignment mark is formed that can be used for an alignment even after the formation of an impurity diffused layer by the planarization of an epitaxial film. A trench is formed in an alignment region of an $N^-$-type layer formed on an $N^+$-type substrate. This trench is used to leave voids after the formation of a $P^-$-type epitaxial film on the $N^-$-type layer. Then, the voids formed in the $N^-$-type layer can be used as an alignment mark. Thus, such a semiconductor substrate can be used to provide an alignment in the subsequent step of manufacturing the semiconductor apparatus. Thus, the respective components constituting the semiconductor apparatus can be formed at desired positions accurately.

2 Claims, 8 Drawing Sheets

(51) Int. Cl.
*H01L 29/06* (2006.01)
*H01L 21/308* (2006.01)
*H01L 21/02* (2006.01)
*H01L 29/66* (2006.01)

(52) U.S. Cl.
CPC .......... *H01L23/544* (2013.01); *H01L 29/0634* (2013.01); *H01L 29/66712* (2013.01); *H01L 2223/54453* (2013.01); *Y10S 438/975* (2013.01); *H01L 2924/0002* (2013.01); *H01L 21/02636* (2013.01); *H01L 21/02664* (2013.01); *H01L 21/308* (2013.01); *H01L 2223/54426* (2013.01)

(56) References Cited

U.S. PATENT DOCUMENTS

| | | | |
|---|---|---|---|
| 5,022,580 A | | 6/1991 | Pedder |
| 5,602,424 A | | 2/1997 | Tsubouchi et al. |
| 5,952,694 A | * | 9/1999 | Miyawaki et al. ............ 257/347 |
| 5,958,800 A | | 9/1999 | Yu et al. |
| 5,963,816 A | * | 10/1999 | Wang et al. ................... 438/401 |
| 6,020,226 A | | 2/2000 | Cerny et al. |
| 6,100,158 A | | 8/2000 | Lee et al. |
| 6,440,816 B1 | * | 8/2002 | Farrow et al. ................. 438/401 |
| 7,233,077 B2 | | 6/2007 | Inomata |
| 7,292,756 B2 | | 11/2007 | Moynihan et al. |
| 7,684,660 B2 | | 3/2010 | Braunisch et al. |
| 2002/0076896 A1 | | 6/2002 | Farrar et al. |
| 2002/0102811 A1 | | 8/2002 | Farrow et al. |
| 2003/0052384 A1 | | 3/2003 | Sato et al. |
| 2003/0136994 A1 | | 7/2003 | Popp et al. |
| 2003/0222327 A1 | | 12/2003 | Yamaguchi et al. |
| 2005/0002596 A1 | | 1/2005 | Leonardsson |
| 2005/0221547 A1 | * | 10/2005 | Yamauchi et al. ............ 438/172 |
| 2007/0128836 A1 | | 6/2007 | Nogami |

FOREIGN PATENT DOCUMENTS

| | | |
|---|---|---|
| JP | 5-275665 | 10/1993 |
| JP | 8-139190 | 5/1996 |
| JP | 8-330423 | 12/1996 |
| JP | 2001-093977 | 4/2001 |
| JP | 2001-196573 | 7/2001 |
| JP | 2001-274398 | 10/2001 |
| JP | 2003-124464 | 4/2003 |
| JP | 2003-229569 | 8/2003 |
| JP | 2003-273355 | 9/2003 |
| JP | 3485081 | 10/2003 |
| JP | 2005-11893 | 1/2005 |
| JP | 2005-19898 | 1/2005 |
| JP | 2005-019898 | 1/2005 |
| JP | 2005-57142 | 3/2005 |
| JP | 2005-086091 | 3/2005 |
| JP | 2005-142335 | 6/2005 |
| JP | 2005-294711 | 10/2005 |
| JP | 2005-317905 | 11/2005 |
| JP | 2007-116190 | 5/2007 |

OTHER PUBLICATIONS

Japan Office action dated Dec. 13, 2011, along with an english translation thereof.
China Office action dated Dec. 12, 2011, along with an english translation thereof.
Japan Office action, dated Mar. 31, 2011 along with an english translation thereof.
China Office action, dated Aug. 26, 2011 along with an english translation thereof.
U.S. Appl. No. 14/448,370 to Nogami et al., filed Jul. 31, 2014.
U.S. Appl. No. 14/448,372 to Nogami et al., filed Jul. 31, 2014.

\* cited by examiner

US 9,034,721 B2

METHOD FOR MANUFACTURING SEMICONDUCTOR SUBSTRATE

CROSS-REFERENCE TO RELATED APPLICATION

This application is a divisional of pending U.S. application Ser. No. 12/964,141, filed on Dec. 9, 2010, which is a divisional of pending U.S. application Ser. No. 12/089,497, filed on Apr. 7, 2008, which is a U.S. National Phase Application of PCT/JP2006/319933, filed Oct. 5, 2006, which claims priority of Japanese Application No. 2005/293087, filed Oct. 6, 2005, and Japanese Application No. 2006/214551, filed on Aug. 7, 2006, the disclosure of each of which is expressly incorporated herein by reference in its entirety.

TECHNICAL FIELD

The present invention relates to a semiconductor substrate that is preferred for the manufacture of a semiconductor apparatus that uses a trench formed in a depth direction of the substrate with a high aspect ratio such as a MOSFET and a super junction MOSFET having a three-dimensional structure and the method for manufacturing the same.

BACKGROUND ART

Conventionally, a semiconductor apparatus that uses a trench formed in a depth direction of a substrate with a high aspect ratio (e.g., MOSFET (see Patent Publication 1 for example), super junction MOSFET (see Patent Publication 2 for example) has been known. A semiconductor apparatus having the structure as described above forms an impurity diffused layer having a high aspect ratio by burying an epitaxial film in a trench (see Patent Publications 3 and 4 for example).

Patent Publication 1: Japanese Unexamined Patent Application Publication No. 2001-274398
Patent Publication 2: Japanese Unexamined Patent Application Publication No. 2003-124464
Patent Publication 3: Japanese Unexamined Patent Application Publication No. 2001-196573
Patent Publication 4: Japanese Unexamined Patent Application Publication No. 2005-317905

DISCLOSURE OF THE INVENTION

Problem to be Solved by the Invention

When an impurity diffused layer having a high aspect ratio is formed by burying an epitaxial film in a trench, a method for manufacturing a semiconductor substrate as described below can be considered for example. FIG. 8 is a sectional view of an example of a part of the steps of manufacturing the same.

First, a semiconductor substrate is prepared structured as shown in FIG. 8(a) so that an N⁻-type layer 102 is formed on an N⁺-type substrate 101. Then, a mask (not shown) is used to form trenches 103 having a plurality of high aspect ratios in a device formation region of the N⁻-type layer 102 as shown in FIG. 8(b). At the same time, a trench 104 is also formed in an alignment region exterior to the device formation region as an alignment mark in a subsequent step. Then, an epitaxial film 105 is grown under conditions in which impurity is doped so as to bury the trench 103 as shown in FIG. 8(c). Thereafter, the epitaxial film 105 formed at the upper part of the trench 103 is subjected to a planarization processing step in which the epitaxial film 105 is planarized to eliminate an uneven part, thereby forming an impurity diffused layer 106 as shown in FIG. 8(d).

As described above, when the epitaxial film 105 is buried in the trench 103 to form the impurity diffused layer 106 having a high aspect ratio, a planarization processing step is used to planarize the uneven part of the epitaxial film 105.

However, when the epitaxial film 105 is buried in the trench 103, the epitaxial film 105 is also buried in the trench 104 formed in the alignment region and thus the uneven part of the trench 104 is eliminated after the planarization processing step. Then, the epitaxial film 105 grows in single crystal to a substrate or a silicon layer as a base. Thus, the existence of only a pure material diffusion layer is recognized in the trench 104 formed in the alignment region as well. In contrast with an oxidized film or non-polycrystalline silicon, such a single crystal impurity diffused layer makes difficult to recognize an interface between an N⁺-type substrate 101 and an N⁻-type layer 102 formed by single crystals by an optical manner or by laser (He—Ne). As a result, the trench 104 formed in the alignment region cannot be used as an alignment mark for the alignment in the subsequent step.

On the other hand, a conventional method for manufacturing a semiconductor substrate buries an epitaxial film in previously-formed trenches a plurality of times to form a diffusion layer having a high aspect ratio. Thus, the aspect ratio can be increased to a limited level. When the aspect ratio of the trenches is increased to a level exceeding the limit, the epitaxial film buried in the trenches may have a burying defect (void). The generation of the void may cause flakedown at the upper part of the void to reduce the breakdown voltage, thus causing a deteriorated element performance.

In particular, in order to improve the breakdown voltage of the above-described super junction structure (P/N column structure) in which an N-type region and a P-type region are alternately arranged in a direction orthogonal to the current direction, the trench depth must be increased. However, when an increased trench depth causes an increased aspect ratio to cause a burying defect (void) in the epitaxial film buried in the trenches, the burying defect (void) causes a crystal fault to reduce the yield of the junction leak and breakdown voltage or to leave resist at a defective burying portion of a trench to cause an in-process contamination.

It is the first objective of the present invention to provide a semiconductor substrate having an alignment mark that can be used for alignment even after an epitaxial film is planarized to form an impurity diffused layer and the method for manufacturing thereof.

It is the second objective of the present invention to provide a method for manufacturing a semiconductor substrate by which a void can be prevented from being generated in an epitaxial film buried in a trench.

Means for Solving the Problem

In order to achieve the first objective, the first characteristic of the present invention is that a semiconductor substrate has a substrate (1) made of single crystal semiconductor and a semiconductor layer (2) made of single crystal formed on the surface of the substrate (1). Voids (3) as an alignment mark are formed in the substrate (1) in an alignment region in the substrate (1) that is different from a device formation region.

In the semiconductor substrate having the structure as described above, the voids formed in the alignment region can be optically recognized for example to the substrate made of single crystal semiconductor. Thus, the voids can be used as an alignment mark to form a trench in a semiconductor layer included in the semiconductor substrate for example to provide alignment for the manufacture of a semiconductor apparatus such as a MOSFET and a super junction MOSFET having a three-dimensional structure.

The second characteristic of the present invention is that a semiconductor has a substrate (21) made of single crystal semiconductor and a semiconductor layer (22) made of single crystal formed on the surface of the substrate. Voids (25) as an alignment mark are formed in the semiconductor layer in an alignment region in the semiconductor layer that is different from a device formation region.

As described above, the same effect as that of the first characteristic also can be obtained by the above structure in which voids as an alignment mark are formed in the semiconductor layer.

In these cases, a trench (4, 23) may be formed in a device formation region of the semiconductor layer and an epitaxially-grown impurity diffused layer (5, 24) may be formed in the trench.

A single void or a plurality of voids may be used. A plurality of voids arranged with an equal interval for example can be easily recognized as voids formed an alignment mark.

The semiconductor substrate having the first characteristic is manufactured by a method for manufacturing that includes, for example, a step of preparing a substrate (1) made of single crystal semiconductor; a step of arranging, on the substrate, a mask material (10) in which an opening is formed in the alignment region in the substrate different from a device formation region; and a step of etching the substrate covered by the mask material to form an alignment mark formation trench (11) in the alignment region; and a step of forming a semiconductor layer (2) made of single crystal on the surface of the substrate so as to form voids (3) in the alignment mark formation trench.

In this case, the step of forming an alignment mark formation trench preferably forms the alignment mark formation trench having a width of 1 to 50 μm for example.

The semiconductor substrate having the second characteristic is manufactured by a method for manufacturing that includes, for example, a step of preparing a substrate (21) made of single crystal semiconductor; a step of forming a semiconductor layer (22) made of single crystal on the surface of the substrate; a step of arranging a first mask material (30) on the semiconductor layer, the first mask material (30) includes an opening formed in an alignment region in the semiconductor layer different from a device formation region; a step of etching the semiconductor layer covered by the first mask material to form an alignment mark formation trench (31) in the alignment region; a step of removing the first mask material to place, on the surface of the semiconductor layer, a second mask material (32) in which an opening is formed in the device formation region of the semiconductor layer; a step of etching the semiconductor layer covered by the second mask material to form a device trench (23) in the device formation region; a step of removing the second mask material to bury an epitaxial film (33) in the device trench so as to form voids (25) in the alignment mark formation trench; and a step of subjecting, to a planarization processing, a part of the epitaxial film that is formed exterior to the device trench.

As described here, instead of performing the step of forming the alignment mark formation trench in the alignment region prior to the step of forming the device trench in the device formation region, the step of forming the alignment mark formation trench in the alignment region also may be performed after the step of forming the device trench in the device formation region.

In these cases, the step of forming an alignment mark formation trench preferably forms the alignment mark formation trench to have a depth deeper than the width of the device trench. This can easily form the epitaxial film to bury the device trench while forming the voids in the alignment mark formation trench.

For example, the alignment mark formation trench can have a depth at which the substrate can be etched.

Furthermore, the formation of the alignment mark formation trench in the alignment region also may be simultaneously performed with the formation of the device trench in the device formation region. This can simplify the steps of manufacturing the semiconductor substrate.

In the method for manufacturing a semiconductor substrate having the second characteristic as described above, the alignment mark formation trench preferably has a width smaller than that of the device trench. This can easily form the epitaxial film to bury the device trench while forming voids in the alignment mark formation trench.

It is noted that reference numerals in the parentheses show the correspondences with specific means described in the embodiments described later.

The invention according to claim 13 is for achieving the above second objective. As shown in FIG. 7, the invention is a method for manufacturing a semiconductor substrate that includes: (a) a step of growing a first epitaxial film 61 on the surface of a substrate body 63; (b) a step of partially etching the first epitaxial film 61 to form a plurality of first trenches 64; (c) a step of growing a second epitaxial film 62 on the entire interior of the plurality of the first trenches 64 and the surface of the first epitaxial film 61 except for the plurality of the first trenches 64; (d) a step of polishing the second epitaxial film 62 to expose the surface of the first epitaxial film 61 and planarizing the upper face of the second epitaxial film 62 buried in the entire interior of the plurality of the first trenches 64; (e) a step of further growing a third epitaxial film 66 having the same composition as that of the first epitaxial film 61 on the upper face of the planarized second epitaxial film 62 and the exposed face of the first epitaxial film 61; (f) a step of etching a part of the third epitaxial film 66 corresponding to the plurality of the first trenches 64 to form a plurality of second trenches 67 to extend the plurality of first trenches 64; (g) a step of further growing a fourth epitaxial film 68 on the entire interior of the plurality of second trenches 67 and the surface of the third epitaxial film 66 except for the plurality of second trenches 67; and (h) a step of polishing the fourth epitaxial film 68 to expose the surface of the third epitaxial film 66 and planarizing the upper face of the fourth epitaxial film 68 buried in the entire interior of the plurality of the second trenches 67.

With regards to whether the epitaxial films 62 and 68 can be buried in the trenches 64 and 67 without causing a void, the shallower the depth B of the trenches 64 and 67 is to the width A of the trenches 64 and 67, the epitaxial films 62 and 68 can be buried in the trenches 64 and 67 without causing a void.

In the method for manufacturing a semiconductor substrate according to claim 13, the formation of the trenches 64 and 67 and the burying of the epitaxial films 62 and 68 are performed by a plurality of steps. Thus, when the epitaxial films 62 and 68 are buried in the trenches 64 and 67, the depth B of the trenches 64 and 67 to the width A of the trenches 64 and 67 can be reduced. Thus, the epitaxial films 62 and 68 can be buried in the trenches 64 and 67 without causing a void in the trenches 64 and 67.

The invention according to claim 14 is the invention according to claim 13 and is characterized in that the step (g) is followed by the repetition of the step (d) to the step (g) one or two times or more.

In the method for manufacturing a semiconductor substrate according to claim 14, the step (d) to the step (g) are repeated three times or more. Thus, even when an aspect ratio of the trenches to be finally obtained is relatively high, the depth B of the trenches to the width A of the trenches when the epitaxial film is buried one time can be reduced. This can effectively prevent a void from being generated in the epitaxial film buried in the trenches.

Effect of the Invention

As described above, according to the present invention, in an alignment region in a substrate different from a device formation region, a void as an alignment mark was formed. This void can be optically recognized to a substrate formed by single crystal semiconductor for example. Thus, this void can be used as an alignment mark to form a trench in a semiconductor layer provided in a semiconductor substrate for example to provide the alignment for manufacturing a semiconductor apparatus such as a MOSFET and a super junction MOSFET having a three-dimensional structure. In this case, in an alignment region in a semiconductor layer different from a device formation region, a semiconductor layer also may include a void as an alignment mark.

When the formation of a trench and the burying of an epitaxial film are separately performed a plurality of times, the trench can have a shallow depth to the width of the trench when the epitaxial film is buried and thus the epitaxial film can be buried in a plurality of trenches without causing a void in the trenches. In particular, if the formation of a trench and the burying of an epitaxial film are repeated three times or more, the trench can have a sufficiently-shallow depth to the depth of the trench in which the epitaxial film is buried even when a trench to be obtained finally has a relatively high aspect ratio. This can effectively avoid a void caused in an epitaxial film buried in the trench.

DESCRIPTION OF REFERENCE NUMERALS

Figure 1:
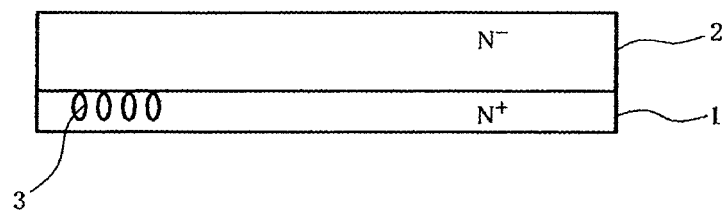
FIG. 1 is a view of the sectional structure of a semiconductor substrate of the first embodiment of the present invention.

1 $N^+$-type substrate
2 $N^-$-type layer
3 Void
4 Trench
5 Impurity diffused layer
6 $N^-$-type layer
10 Mask material
11 Trench
12 Oxidized film
13 Epitaxial film
21 $N^+$-type substrate
22 $N^-$-type layer
23 Trench
24 Impurity diffused layer
25 Void
26 $N^-$-type layer
30 Mask material
31 Trench
32 Oxidized film
33 Epitaxial film
60 Semiconductor substrate
61 First epitaxial film
62 Second epitaxial film
63 Substrate body
64 First trench
66 Third epitaxial film
67 Second trench
68 Fourth epitaxial film

BEST MODE FOR CARRYING OUT THE INVENTION

Hereinafter, embodiments of the present invention will be described with reference to the drawings. In the respective embodiments shown below, the same or similar components will be denoted with the same reference numerals.

First Embodiment

The first embodiment of the present invention will be described. FIG. 1 is a sectional view of a semiconductor substrate of the first embodiment. As shown in FIG. 1, an $N^+$-type substrate 1 made of single crystal silicon has thereon an $N^-$-type layer 2 made of single crystal silicon to constitute a semiconductor substrate. This semiconductor substrate is structured so that an alignment region of the $N^+$-type substrate 1 (specifically, a position different from a device formation region) has voids 3 in the $N^+$-type substrate 1. These voids 3 are formed with an equal interval there among for example.

In the semiconductor substrate having the structure as described above, the voids 3 formed in the alignment region can be optically recognized for example to the $N^+$-type substrate 1 made of single crystal silicon. Thus, these voids 3 can be used as an alignment mark to form a trench in the $N^-$-type layer 2 provided in the semiconductor substrate for example to provide alignment in the manufacture of a semiconductor apparatus such as a MOSFET and a super junction MOSFET having a three-dimensional structure.

Figure 2:
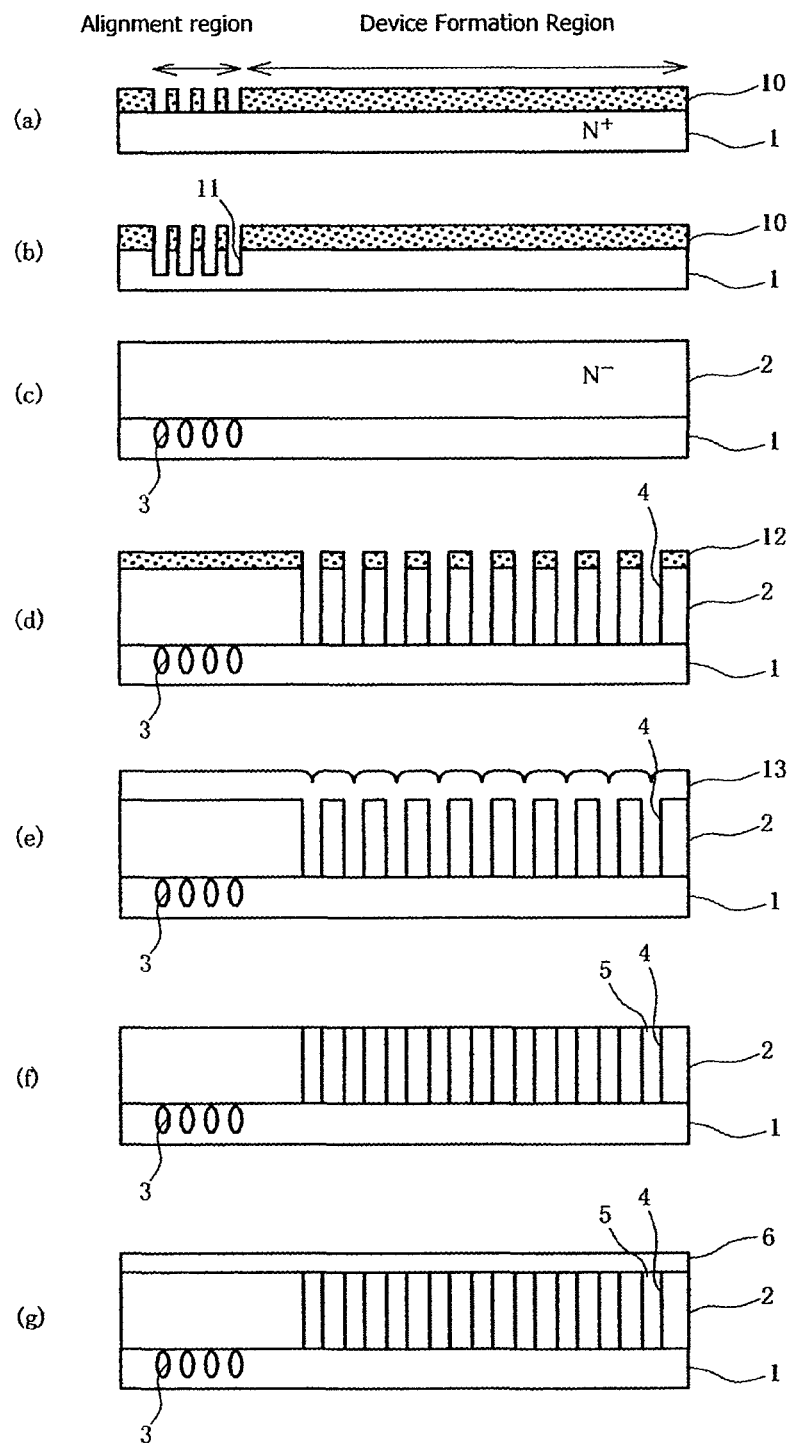
FIG. 2 is a sectional view of steps of manufacturing a semiconductor apparatus using a semiconductor substrate manufactured by steps of manufacturing including the steps of manufacturing the semiconductor substrate shown in FIG. 1.

Next, the following section will be describe a method for manufacturing a semiconductor apparatus using a semiconductor substrate including a method for manufacturing the semiconductor substrate having the structure as described above. FIG. 2 is a sectional view of manufacture steps of a semiconductor apparatus using a semiconductor substrate manufactured by manufacture steps including the manufacture steps of the semiconductor substrate shown in FIG. 1.

First, in a step shown in FIG. 2(a), the $N^+$-type substrate 1 made of single crystal silicon is prepared and the $N^+$-type substrate 1 has thereon a mask material 10 such as resist. Then, in the alignment region, positions in the mask material 10 at which the voids 3 as an alignment mark are to be formed are opened. As a result, openings having an identical width are formed in the mask material 10 with an equal interval for example.

Next, in a step shown in FIG. 2(b), the $N^+$-type substrate 1 covered by the mask material 10 is etched to form, in the alignment region of the $N^+$-type substrate 1, the trenches 11 having an identical width arranged with an equal interval for example. The trench 11 has a width of 50 μm or less, a depth of 1 μm or more, and has a thickness equal to or lower than that of the $N^+$-type substrate 1. The trench 11 may be etched, for example, by an anisotropic dry etching using Reactive Ion Etching (RIE) or an anisotropic wet etching using TMAH or KOH for example.

In a step shown in FIG. 2(c), the $N^-$-type layer 2 is epitaxially grown on the surface of the $N^+$-type substrate 1. In this step, the epitaxial growth at the surface of the $N^+$-type substrate 1 can be promoted while suppressing the epitaxial growth into the trenches 11 formed in the $N^+$-type substrate 1.

For example, any of monosilane (SiH), disilane (SiH), dichlorosilane ($SiH_2Cl_2$), trichlorosilane ($SiHCl_3$), and silicon tetrachloride ($SiCl_4$) is used as semiconductor source gas for epitaxial growth. In particular, any of dichlorosilane ($SiH_2Cl_2$), trichlorosilane ($SiHCl_3$), and silicon tetrachloride ($SiCl_4$) may be used as silicon source gas.

At this time, preferable conditions are that no epitaxial film is grown in the trench 11. However, an epitaxial film may be grown so as not to entirely bury the trench 11. Thus, a region of the trench 11 on which no epitaxial film is formed is left as the void 3 in the surface of the $N^+$-type substrate 1.

In a step shown in FIG. 2(d), an oxidized film 12 by thermal oxidation or CVD or the like is formed on the $N^-$-type layer 2 as mask material. Then, a desired position of the oxidized film 12 can be accurately etched in a device formation region to open the position by using the void 3 as an alignment mark to provide alignment with an etching mask of the oxidized film 12. Then, the N-type layer 2 is etched by using the oxidized film 12 as mask material to form a plurality of trenches 4 in the $N^-$-type layer 2 arranged with an equal interval.

In a step shown in FIG. 2(e), the oxidized film 12 used as mask material is removed to subsequently form a P-type epitaxial film 13 for example so as to bury the trenches 4. This formation is performed based on conditions according to which a rate control can be provided to promote the growth of the epitaxial film 13 into the trenches 4 formed in the $N^-$-type layer 2.

For example, semiconductor source gas (silicon source gas) for epitaxial growth composed of any of monosilane ($SiH_4$), disilane ($Si_2H_6$), dichlorosilane ($SiH_2Cl_2$), trichlorosilane ($SiHCl_3$), and silicon tetrachloride ($SiCl_4$) can be used to further suppress a defect or a void in the buried epitaxial film. In particular, any of dichlorosilane ($SiH_2Cl_2$), trichlorosilane ($SiHCl_3$), and silicon tetrachloride ($SiCl_4$) may be used as silicon source gas. Halide gas composed of any of hydrogen chloride (HCl), chlorine ($Cl_2$), fluorine ($F_2$), chlorine trifluoride ($ClF_3$), hydrogen fluoride (HF), and hydrogen bromide (HBr) can be used to mix the halide gas with silicon source gas to form an epitaxial film. Thus, the resultant buried epitaxial film can be suppressed from including a void or a defect.

An upper limit value of the film formation temperature is 950 degrees when monosilane or disilane is used as semiconductor source gas, 1100 degrees when dichlorosilane is used as semiconductor source gas, 1150 degrees when trichlorosilane is used as semiconductor source gas, or 1200 degrees when silicon tetrachloride is used as semiconductor source gas. A lower limit value of the growth temperature is 800 degrees when the film formation vacuum degree is in a range from a normal pressure to 100 Pa and is 600 degrees when the film formation vacuum degree is in a range of 100 Pa to $1\times10^{-5}$ Pa. An experiment shows that this lower limit value can provide epitaxial growth without causing crystal fault.

Thereafter, in a step shown in FIG. 2(f), the uneven part of the epitaxial film 13 is eliminated by a planarization processing step by Chemical Mechanical Polishing (CMP) for example. As a result, the epitaxial film 13 is left in the trench 4 to form an impurity diffused layer 5.

Thereafter, as shown in a step of FIG. 2(g) for example, a step of manufacturing a remaining semiconductor apparatus is performed as a subsequent step by forming an $N^-$-type layer 6 on the $N^-$-type layer 2 and the impurity diffused layer 5 for example, thereby completing the semiconductor apparatus using the trench 4 having a high aspect ratio. This step also can use the void 3 as an alignment mark to provide alignment in a photolithography step in a subsequent step to accurately form the respective components constituting the semiconductor apparatus at desired positions.

As described above, in the semiconductor substrate of the first embodiment, the void 3 formed in the $N^+$-type substrate 1 can be used as an alignment mark. Thus, the semiconductor substrate as described above can be used to provide alignment in the subsequent step of manufacturing the semiconductor apparatus e.g., a formation step of the trench 4 formed in FIG. 2(f). Therefore, the respective components constituting the semiconductor apparatus can be accurately formed at desired positions.

Second Embodiment

Figure 3:
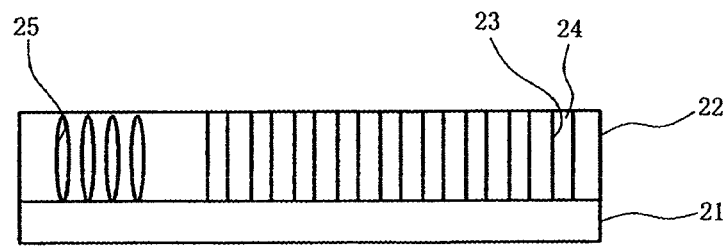
FIG. 3 is a view of the sectional structure of a semiconductor substrate of the second embodiment of the present invention.

The second embodiment of the present invention will be described. FIG. 3 is a sectional view of a semiconductor substrate of the second embodiment. As shown in FIG. 3, an $N^+$-type substrate 21 made of single crystal silicon has thereon an $N^-$-type layer 22 made of single crystal silicon. An impurity diffused layer 24 is formed in the trench 23 formed in the $N^-$-type layer 22, thereby constituting a semiconductor substrate. This semiconductor substrate is structured so that the $N^-$-type layer 22 includes therein voids 25 in the alignment region of the $N^-$-type layer 22. These voids 25 are formed with an equal interval for example.

In the semiconductor substrate having the structure as described above, the voids 25 formed in the alignment region can be optically recognized to the $N^-$-type layer 22 made of single crystal silicon. Thus, the voids 25 can be used as an alignment mark to form the trenches 23 in the $N^-$-type layer 22 provided in the semiconductor substrate, for example. This can provide alignment for a semiconductor apparatus for manufacturing a MOSFET and a super junction MOSFET having a three-dimensional structure.

Figure 4:
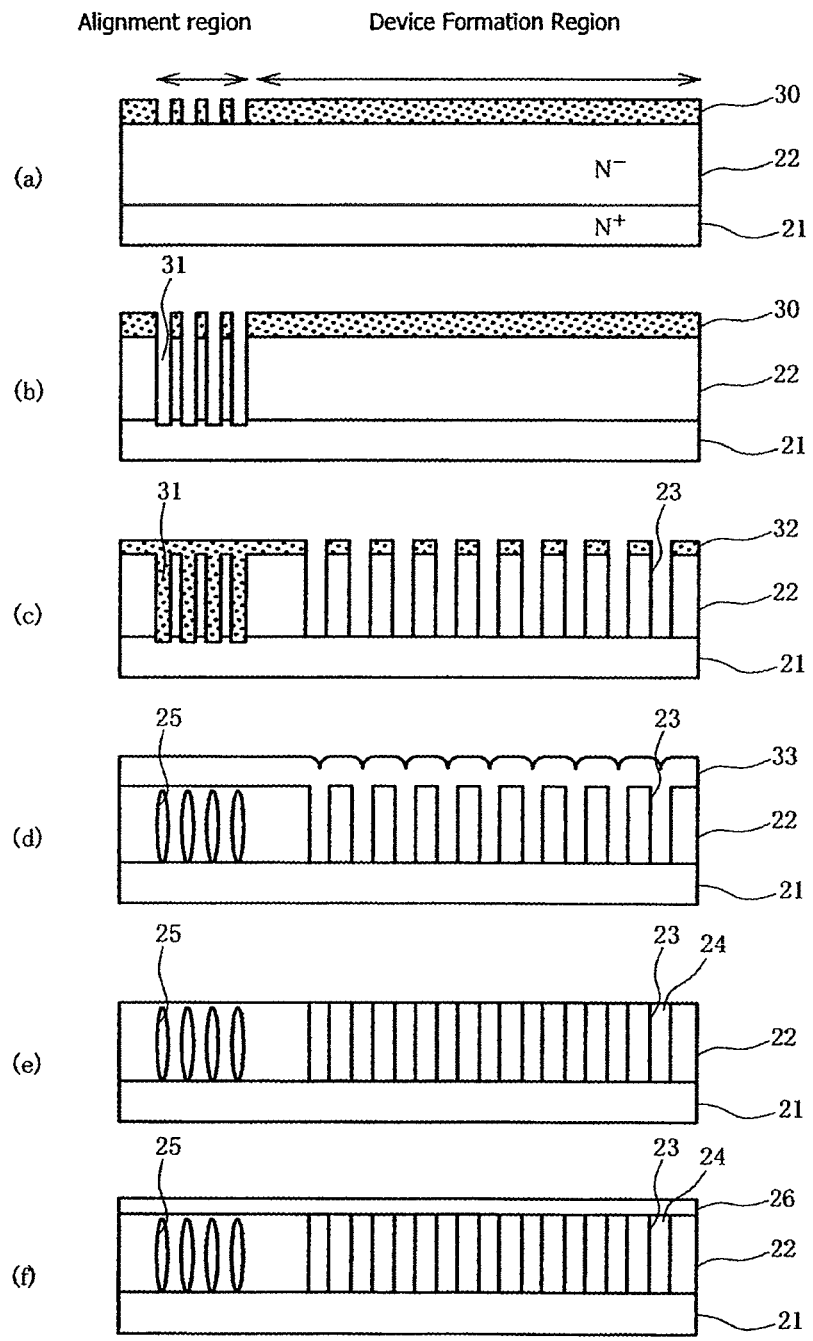
FIG. 4 is a sectional view of steps of manufacturing a semiconductor apparatus using a semiconductor substrate manufactured by steps of manufacturing including the steps of manufacturing the semiconductor substrate shown in FIG. 3.

Next, the following section will describe a method for manufacturing a semiconductor apparatus using a semiconductor substrate including the method for manufacturing the semiconductor substrate having the structure as described above. FIG. 4 is a sectional view of manufacture steps of a semiconductor apparatus using a semiconductor substrate manufactured by manufacture steps including the manufacture steps of the semiconductor substrate shown in FIG. 3.

First, in a step shown in FIG. 4(a), the N$^+$-type substrate 21 made of single crystal silicon is prepared and the N$^-$-type layer 22 is epitaxially grown on the N$^+$-type substrate 21. Then, a mask material 30 such as resist is arranged on the surface of the N$^-$-type layer 22. Then, in the alignment region, a part of the mask material 30 at which the voids 25 as an alignment mark are to be formed is opened. As a result, openings having an equal width are formed in the mask material 30 with an equal interval for example.

In a step shown in FIG. 4(b), the N$^-$-type layer 22 covered by the mask material 30 is etched to form trenches 31 having an equal width in the alignment region of the N$^-$-type layer 22 with an equal interval for example based on conditions in which the trenches 31 have a width smaller than that of the trenches 23 (e.g., smaller than 1 to 50 μm) or the trenches 31 are deeper than the trenches 23 (e.g., 1 to 50 μm or more). In the case of the second embodiment, the trenches 31 have a width smaller than that of the trenches 23 and the trenches 31 are formed to a depth at which the N$^+$-type substrate 21 can be etched so that the trenches 31 are deeper than the trenches 23. The trenches 31 may be etched by an anisotropic dry etching using RIE or an anisotropic wet etching using TMAH or KOH for example.

In a step shown in FIG. 4(c), the mask material 30 is removed to subsequently form an oxidized film 32 by thermal oxidation or CVD or the like as mask material on the surface of the N$^-$-type layer 22. This step also may be performed so as to form the oxidized film 32 not only on the surface of the N$^-$-type layer 22 but also in the trenches 31. In this case, the oxidized film 32 may be formed in the entirety or a part of the interior of the trenches 31. Thereafter, in the device formation region, a desired position of the oxidized film 32 is etched and opened by using the trenches 31 as an alignment mark to provide alignment with the etching mask of the oxidized film 32. Thus, the desired position of the oxidized film 32 can be accurately opened. Then, the oxidized film 32 used as mask material is etched to form the trenches 23 in the N$^-$-type layer 22 with an equal interval.

In a step shown in FIG. 4(d), the oxidized film 32 is removed. At this time, the oxidized film 32 arranged in the trenches 31 may be removed imperfectly. Then, a P$^-$-type epitaxial film 33 for example is formed so as to bury the trenches 23 formed in the N$^-$-type layer 22 based on conditions according to which a rate control can be provided to promote the growth of the epitaxial film 33 into the trenches 23 formed in the N$^-$-type layer 22. The conditions are the same as those of the above-described step of FIG. 2(e) of the first embodiment.

As a result, the epitaxial film 33 is buried in the trenches 23 that have a width larger or smaller than that of the trenches 31. Thus, the trenches 31 are not perfectly buried by the epitaxial film 33, leaving the voids 25.

Thereafter, in a step shown in FIG. 4(e), an uneven part of the epitaxial film 33 is eliminated by a planarization processing step by CMP for example. As a result, the epitaxial film 33 is left in the trenches 23 to form the impurity diffused layer 24.

Then, as shown in a step of FIG. 4(f) for example, as in the step of FIG. 2(g) of the first embodiment, a subsequent step of manufacturing the remaining semiconductor apparatus is performed by forming the N$^-$-type layer 26 on the N$^-$-type layer 22 and the impurity diffused layer 24 for example to complete the semiconductor apparatus using the trenches 23 having a high aspect ratio. This step also uses the voids 25 as an alignment mark to provide alignment with a subsequent photolithography step. Thus, the respective components constituting the semiconductor apparatus can be formed at desired positions accurately.

As described above, in the semiconductor substrate of the second embodiment, the voids 25 formed in the N$^-$-type layer 22 can be used as an alignment mark. Thus, the semiconductor substrate as described above can be used to provide alignment in the subsequent step of manufacturing a semiconductor apparatus. Thus, the respective components constituting the semiconductor apparatus can be formed at desired positions accurately.

Third Embodiment

The following section will describe the third embodiment of the present invention. The third embodiment simultaneously forms the trenches 31 for forming the voids 25 used as an alignment mark shown in the second embodiment and the trenches 23 for forming the impurity diffused layer 24 having a high aspect ratio. Thus, the following section will describe a difference of the third embodiment from the second embodiment and the same structures as those of the second embodiment will not be further described.

Figure 5:
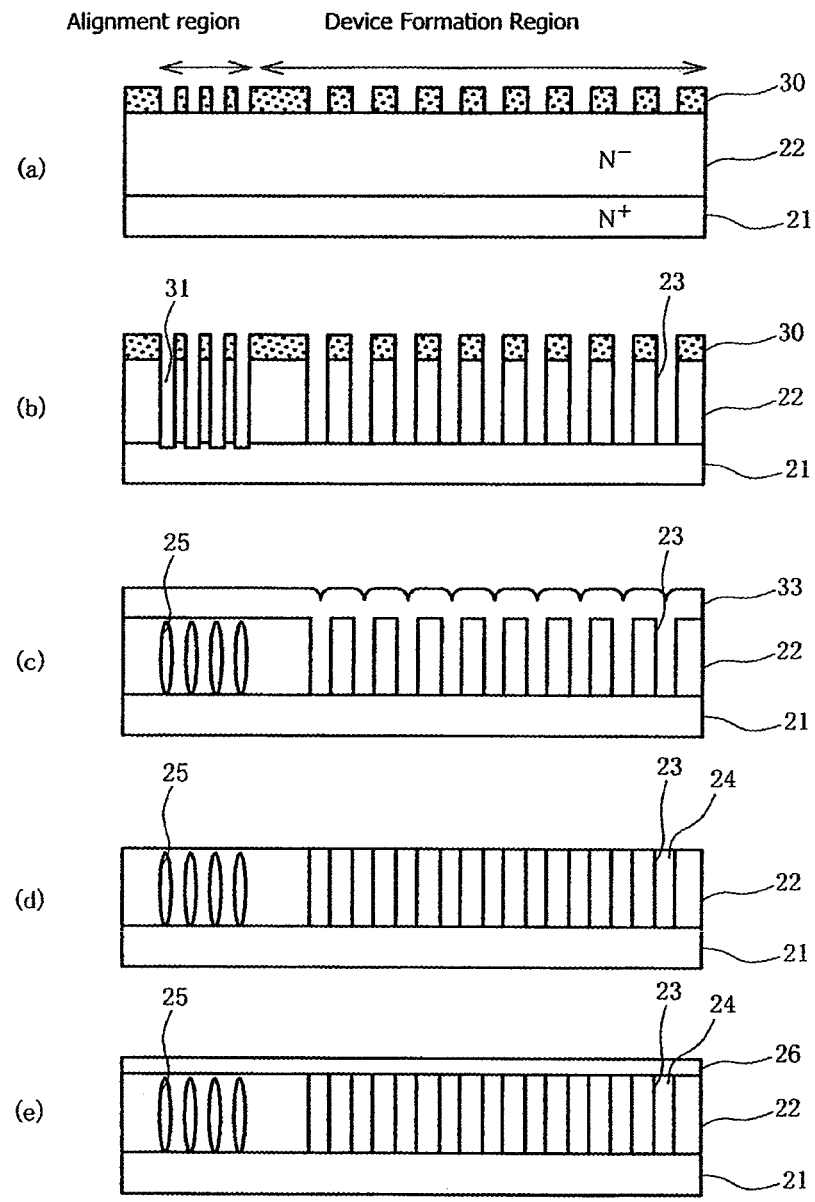
FIG. 5 is a sectional view of steps of manufacturing a semiconductor apparatus using a semiconductor substrate manufactured by manufacture steps including the manufacture steps of a semiconductor substrate according to the third embodiment of the present invention.

FIG. 5 is a sectional view of manufacture steps of a semiconductor apparatus using a semiconductor substrate manufactured by manufacture steps including the manufacture steps of a semiconductor substrate according to the third embodiment of the present invention.

First, in a step shown in FIG. 5(a), the same step as the above-described step of FIG. 4(a) is performed to form the N$^-$-type layer 22 on the surface of the N$^+$-type substrate 21 to further arrange the mask material 30 on the surface of the N$^-$-type layer 22. Then, in the alignment region, a part of the mask material 30 at which the voids 25 as an alignment mark are to be formed is opened and a part in the device formation region at which the trenches 23 are to be formed in the mask material 30 is opened.

Next, in a step shown in FIG. 5(b), the N$^-$-type layer 22 covered by the mask material 30 is etched to simultaneously perform the formation of the trenches 31 in the alignment region of the N$^-$-type layer 22 and the formation of the trenches 23 in the device formation region of the N$^-$-type layer 22 so that the trenches 31 have a width smaller than that of the trenches 23 (e.g., smaller than 1 to 50 μm).

In a step shown in FIG. 5(c), the mask material 30 is removed to subsequently form the P$^-$-type epitaxial film 33 for example so as to bury the trenches 23 formed in the N$^-$-type layer 22 based on conditions according to which a rate control can be provided to promote the growth of the epitaxial film 33 into the trenches 23 formed in the N$^-$-type layer 22. The conditions are the same as those of the above-described step of FIG. 2(e) of the first embodiment.

As a result, the epitaxial film 33 is buried in the trenches 23 that have a width larger than that of the trenches 31. Thus, the trenches 31 are imperfectly buried by the epitaxial film 33 to leave the voids 25.

Thereafter, in a step shown in FIG. 5(d), the same step as that of FIG. 4(e) is performed to form the impurity diffused layer 24.

Then, as shown in a step of FIG. 5(e) for example, the subsequent step of manufacturing the remaining semiconductor apparatus is performed as in the step of FIG. 2(g) of the first embodiment by forming the N⁻-type layer 26 on the N⁻-type layer 22 and the impurity diffused layer 24 for example. As a result, the semiconductor apparatus using the trenches 23 having a high aspect ratio is completed.

As described above, the third embodiment simultaneously performs the formation of the trenches 31 for forming the voids 25 as an alignment mark and the formation of the trenches 23 for forming the impurity diffused layer 24 having a high aspect ratio. This can eliminate a step that is required only to form the voids 25 as an alignment mark and thus can simplify the manufacture steps of the semiconductor substrate and the semiconductor apparatus.

Fourth Embodiment

The following section will describe the fourth embodiment of the present invention. The fourth embodiment forms the trenches 23 for forming the impurity diffused layer 24 having a high aspect ratio to subsequently form the trenches 31 for forming the voids 25 used as an alignment mark shown in the second embodiment. The following section will describe a difference of the fourth embodiment from the second embodiment. The same structures as those of the second embodiment will not be further described.

Figure 6:
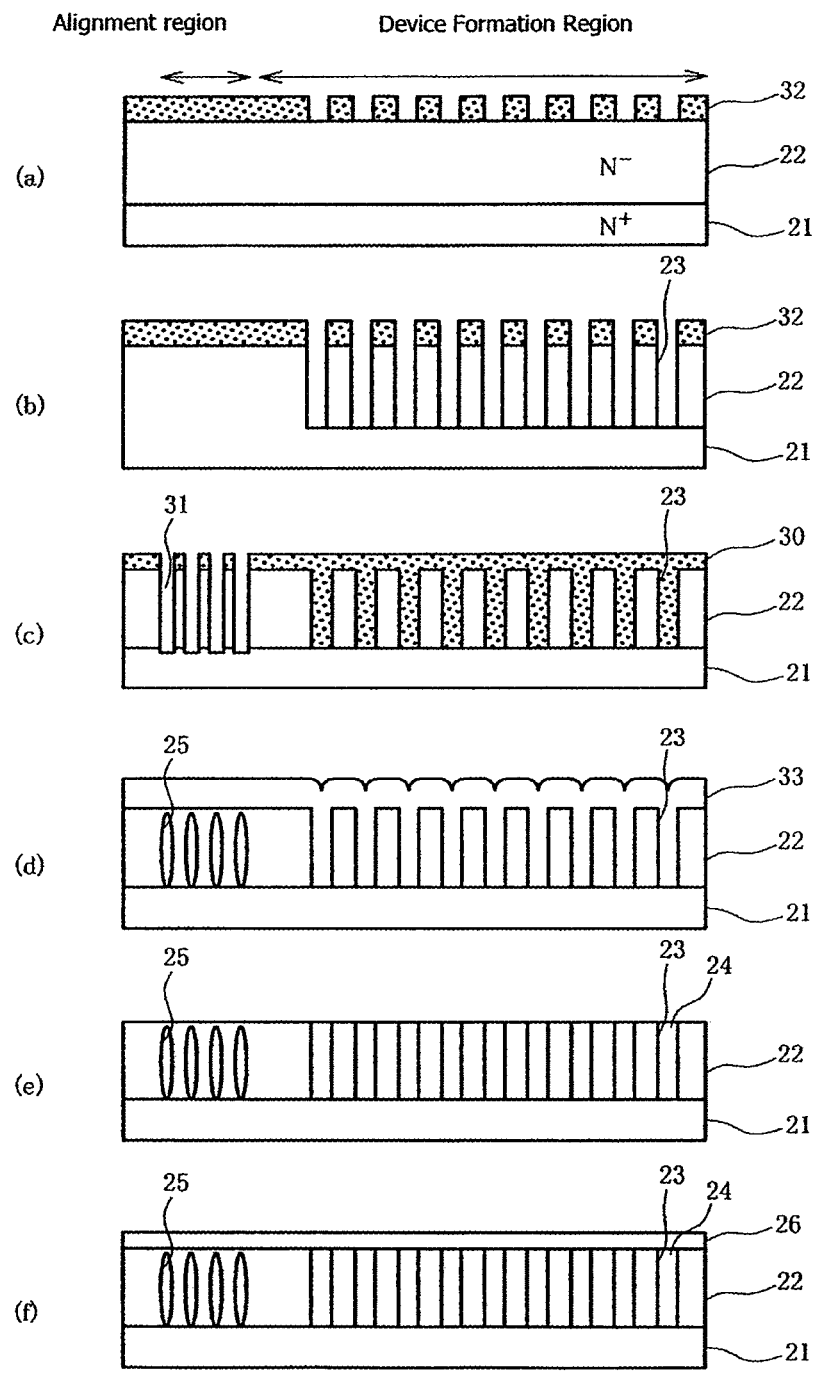
FIG. 6 is a sectional view of manufacture steps of a semiconductor apparatus using a semiconductor substrate manufactured by manufacture steps including the manufacture steps of a semiconductor substrate according to the fourth embodiment of the present invention.

FIG. 6 is a sectional view of manufacture steps of a semiconductor apparatus using a semiconductor substrate manufactured by manufacture steps including the manufacture steps of a semiconductor substrate according to the fourth embodiment.

In a step shown in FIG. 6(a), the same step as the above-described step of FIG. 4(a) is performed to form the N⁻-type layer 22 on the surface of the N⁺-type substrate 21. Then, the same step as the step of FIG. 4(c) is performed to arrange the oxidized film 32 as mask material on the surface of the N⁻-type layer 22. Thereafter, a part in the device formation region of the oxidized film 32 at which the trenches 23 are to be formed is opened.

Next, in a step shown in FIG. 6(b), the N⁻-type layer 22 covered by the oxidized film 32 is etched to form the trenches 23 in the device formation region of the N⁻-type layer 22.

Next, in a step shown in FIG. 6(c), the oxidized film 32 is removed to subsequently use the same step as the step of FIG. 4(a) to form the mask material 30 on the surface of the N⁻-type layer 22. This step also may be performed so as to form the mask material 30 not only at the surface of the N⁻-type layer 22 but also in the trenches 23. In this case, the mask material 30 may be formed in the entirety or a part of the interior of the trenches 31. Thereafter, a desired part in the alignment region of the mask material 30 is etched and opened. Then, the N⁻-type layer 22 covered by the mask material 30 is etched to form the trenches 31 in the N⁻-type layer 22 with an equal interval.

Thereafter, in a step shown in FIG. 6(d), the same step as that of FIG. 4(d) is performed to bury the epitaxial film 33 in the trenches 23 and to form the voids 25 as an alignment mark. In steps shown in FIG. 6(e) and FIG. 6(f), the same steps as those of FIG. 4(e) and FIG. 4(f) are performed and the subsequent step of manufacturing the remaining semiconductor apparatus is performed to complete the semiconductor apparatus using the trenches 23 having a high aspect ratio. These steps also use the voids 25 as an alignment mark to provide alignment in the subsequent photolithography step. Thus, the respective components constituting the semiconductor apparatus can be formed at desired positions accurately.

As described above, as in the fourth embodiment, the trenches 23 for forming the impurity diffused layer 24 having a high aspect ratio may be formed to subsequently form the trenches 31 for forming the voids 25 used as an alignment mark.

Other Embodiments

The first embodiment has exemplarily described a semiconductor substrate having the structure shown in FIG. 1 (specifically, the structure in which the N⁻-type layer 2 is formed on the surface of the N⁺-type substrate 1). However, another structure also may be used in which a semiconductor substrate for which steps up to the step of FIG. 2(f) are completed (i.e., a structure in which the impurity diffused layer 5 is formed in the trench 4). Similarly, the second embodiment also may use a semiconductor substrate having a structure in which the trenches 23 are not yet formed (i.e., a structure for which steps up to the step of FIG. 4(b) are completed).

The above respective embodiments have described a case where only the impurity diffused layers 5 and 24 each of consisting of one layer are formed in the trenches 4 and 23 formed in the device formation region. However, the impurity diffused layers 5 and 24 also may be composed of a plurality of conductivity-type layers or layers having different concentrations.

Although the above respective embodiments have described a case where the N⁻-type layers 2 and 22 are formed on the N⁺-type substrates 1 and 21, they are not limited to these conductivity types. For example, a semiconductor substrate and a semiconductor layer formed on the semiconductor substrate also may be both the P-type ones or also may be of different conductivity types.

Fifth Embodiment

The following section will describe the fifth embodiment of the present invention.

Figure 7:
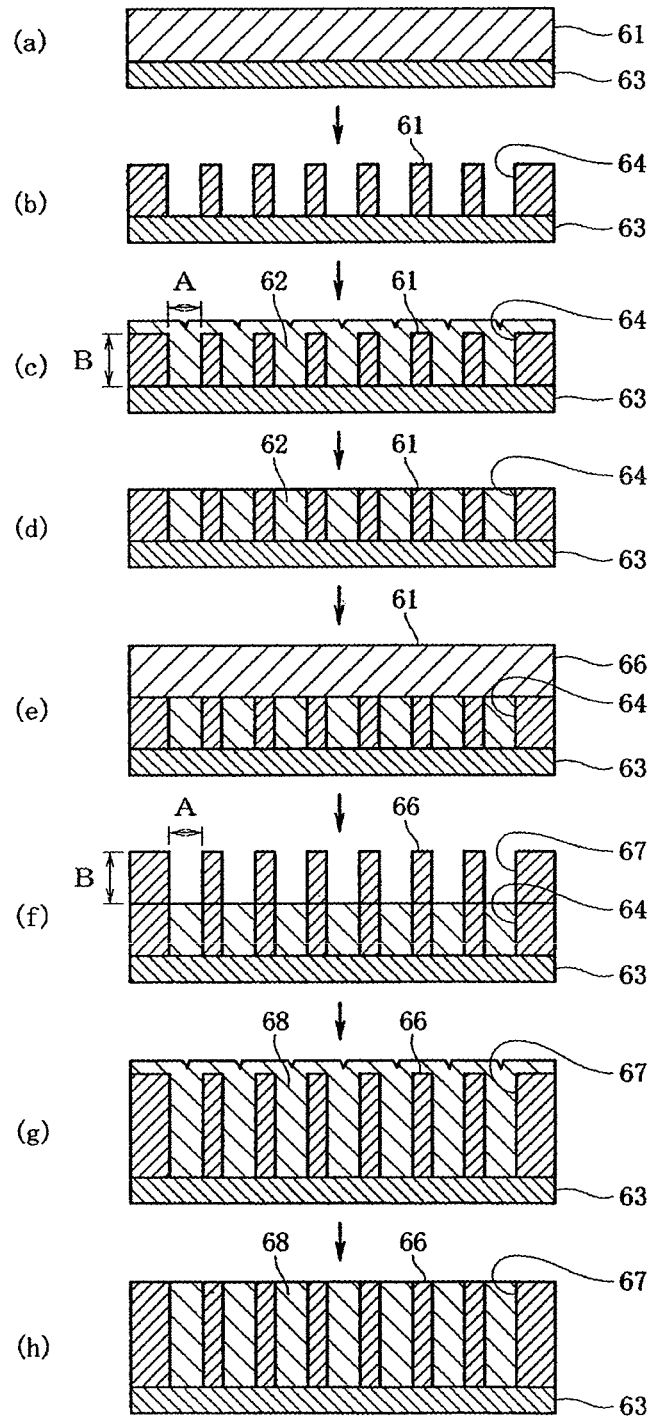
FIG. 7 is a view of steps of a method for manufacturing a semiconductor substrate of the fifth embodiment of the present invention.
Figure 8:
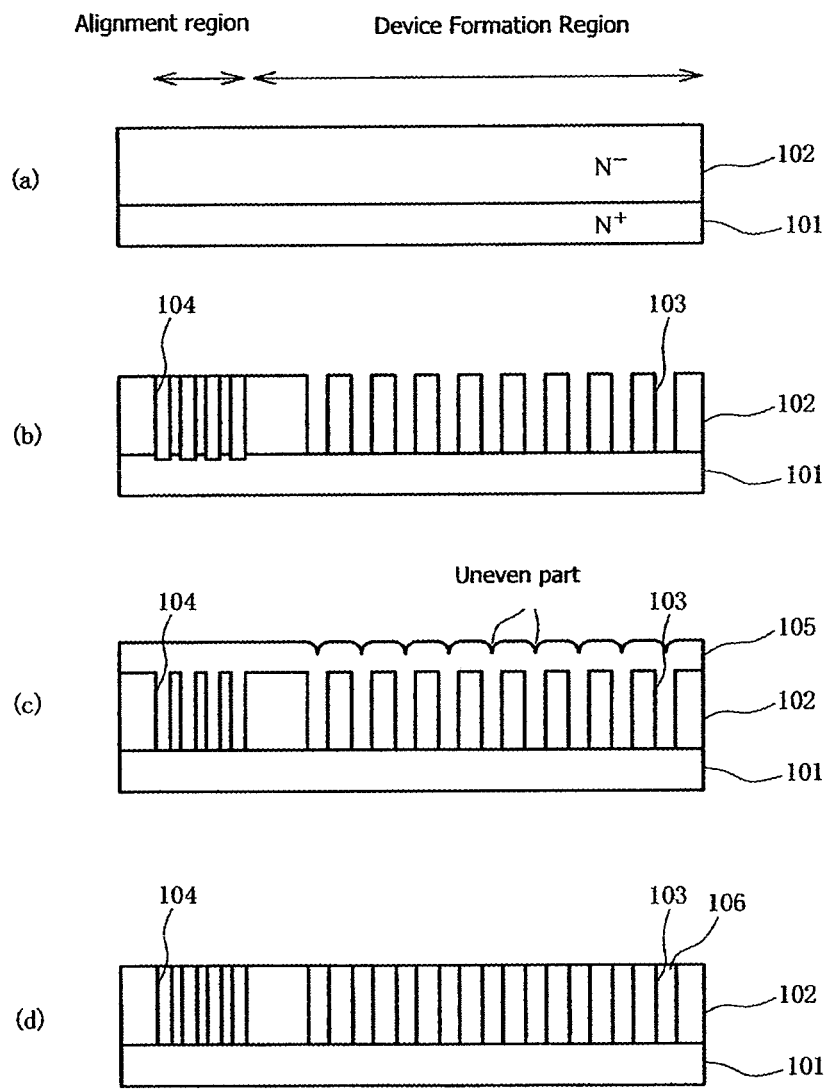
FIG. 8 is a sectional view of manufacture steps of a semiconductor apparatus based on the examination by the present inventors.

As shown in FIG. 7, the semiconductor substrate includes an N⁺-type substrate body 63. Epitaxial films 61 and 66 are formed on the substrate body 63. The substrate body 63 is an N⁺-type silicon single crystal substrate doped with impurity such as phosphorus, arsenic, or antimony. The epitaxial films 61 and 66 are an N-type silicon single crystal layer doped with impurity such as phosphorus, arsenic, or antimony. The epitaxial films 61 and 66 are partially removed by etching to form the rib-shape epitaxial films 61 and 66 on the surface of the substrate body 63 with a predetermined interval. Trenches 64 and 67 among the epitaxial films 61 and 66 are filled with epitaxial films 62 and 68 consisting of P-type silicon single crystal doped with impurity such as boron, gallium, or indium.

The following section will describe a method for manufacturing such a semiconductor apparatus of the present invention. First, as shown in FIG. 7(a), the N⁺-type substrate body 63 is prepared to form the first N-type first epitaxial film 61 thereon. Specifically, the first epitaxial film 61 is grown in a temperature range of 400 to 1200 degrees while supplying silane gas as raw material gas to the surface of the substrate body 63.

Next, as shown in FIG. 7(b), the first epitaxial film 61 is partially etched to form the first trenches 64. Specifically, a silicon oxidized film (not shown) is formed on the first N-type epitaxial film 61 to pattern this silicon oxidized film so as to have a predetermined trench having a predetermined shape. This patterned silicon oxidized film is used as a mask to subject the first N-type epitaxial film 61 to an anisotropic etching (RIE) or a wet etching by alkaline anisotropic etching liquid (e.g., KOH, TMAH) to form the first trenches 64. Thereafter, the silicon oxidized film (not shown) used as a mask is removed. In this manner, the first epitaxial films 61 having a rib-shape are formed on the surface of the substrate body 63 with a predetermined interval and the first trenches 64 are formed among the first epitaxial films 61, respectively.

Next, as shown in FIG. 7(c), the second epitaxial film 62 is grown on the surface of the first epitaxial film 61 except for the entire interior of the first trenches 64 and the first trenches 64. Specifically, the vapor growth method is used to form the second epitaxial film 62 in a temperature range of 400 to 1150 degrees while suppressing raw material gas to the first epitaxial film 61 including the inner face of the first trenches 64 and the second epitaxial film 62 is buried in the first trenches 64. In the step of burying the second epitaxial film 62 in the first trenches 64 (at least in the final burying step), mixed gas of semiconductor source gas and halide gas is preferably used as raw material gas supplied for the formation of the first epitaxial film 61. Semiconductor source gas may include monosilane ($SiH_4$), disilane ($Si_2H_6$), dichlorosilane ($SiH_2Cl_2$), trichlorosilane ($SiHCl_3$), or silicon tetrachloride ($SiCl_4$) for example. In particular, the semiconductor source gas is preferably any of dichlorosilane ($SiH_2Cl_2$), trichlorosilane ($SiHCl_3$), or silicon tetrachloride ($SiCl_4$). Halide gas is preferably any of hydrogen chloride (HCl), chlorine ($Cl_2$), fluorine ($F_2$), chlorine trifluoride ($ClF_3$), hydrogen fluoride (HF), and hydrogen bromide (HBr) and is more preferably hydrogen chloride (HCl) in particular.

When mixed gas of semiconductor source gas and halide gas is supplied as raw material gas, halide gas thereof functions as etching gas. The etching gas is provided with a controlled supply rate so that the etching rate is higher at the opening of the first trenches 64 than at the interior of the first trenches 64. As a result, the growth rate is lower at the opening of the first trenches 64 than at a deeper portion. Thus, with regards to the second epitaxial film 62 on the side faces of the first trenches 64, the bottom part of the first trenches 64 has a larger thickness than that of the opening of the first trenches 64. Thus, as shown in FIG. 2(c), the second epitaxial film 62 can be buried in the first trenches 64 without causing a void in the first trenches 64.

Next, as shown in FIG. 7(d), the second epitaxial film 62 is polished to expose the surface of the first epitaxial film 61 and to planarize the upper face of the second epitaxial film 62 buried in the entire interior of the first trenches 64. This polishing can be performed by CMP for example.

Next, as shown in FIG. 7(e), the third epitaxial film 66 having the same composition as that of the first epitaxial film 61 is further grown on the planarized upper face of the second epitaxial film 62 and the exposed face of the first epitaxial film 61. This formation of the third epitaxial film 66 is performed by the same procedure as that of the formation of the first epitaxial film 61. Specifically, the vapor growth method is used to grow the third epitaxial film 66 in a temperature range of 400 to 1200 degrees while supplying silane gas as raw material gas to the planarized upper face of the second epitaxial film 62 and the exposed face of the first epitaxial film 61.

Next, as shown in FIG. 7(f), parts of the third epitaxial film 66 corresponding to the first trenches 64 are etched to form the second trenches 67 to extend the first trenches 64. Specifically, a silicon oxidized film (not shown) is formed on the third epitaxial film 66 and a part of this silicon oxidized film corresponding to the first trench 64 is removed and is patterned to have a predetermined shape. Then, this patterned silicon oxidized film is used as a mask to subject the third epitaxial film 66 to an anisotropic etching (RIE) or a wet etching by alkaline anisotropic etching liquid (e.g., KOE, TMAH) to form the second trenches 67 to extend the first trenches 64. Thereafter, the silicon oxidized film (not shown) used as a mask is removed.

Next, as shown in FIG. 7(g), the fourth epitaxial film 68 is further grown on the entire interior of the second trenches 67 and the surface of the third epitaxial film 66 other than the second trenches 67. This formation of the fourth epitaxial film 68 is performed by the same procedure as that of the above-described formation of the second epitaxial film 62. Specifically, the vapor growth method is used to form the fourth epitaxial film 68 in a temperature range of 400 to 1150 degrees while supplying raw material gas to the third epitaxial film 66 including the inner face of the second trenches 67 to bury the fourth epitaxial film 68 in the second trenches 67.

Next, as shown in FIG. 7(h), the fourth epitaxial film 68 is polished to expose the surface of the third epitaxial film 66 and the upper face of the fourth epitaxial film 68 buried in the entire interior of the second trenches 67 is planarized. As a result, a semiconductor substrate is obtained in which a P-type region and an N-type region are alternately arranged in the lateral direction.

Whether the epitaxial films 62 and 68 can be buried in the trenches 64 and 67 without causing a void or not depends on an aspect ratio (B/A) that is represented by a depth B of the trenches 64 and 67 to a width A of the trenches 64 and 67. The shallower depth B the trenches 64 and 67 have to the width A of the trenches 64 and 67 (i.e., the smaller aspect ratio (B/A) is), the epitaxial films 62 and 68 can be more securely buried in the trenches 64 and 67 without causing a void. According to the method for manufacturing a semiconductor substrate of the present invention, the formation of the trenches 64 and 67 and the burying of the epitaxial films 62 and 68 are performed in a plurality of steps. Thus, the aspect ratio of the trenches 64 and 67 when the epitaxial films 62 and 68 are buried can be reduced. As a result, the epitaxial films 62 and 68 can be buried in the trenches 64 and 67 without causing a void.

In the fifth embodiment, it was described that the formation of the trenches 64 and 67 and the burying of the epitaxial films 62 and 68 are performed in two steps. When an aspect ratio of trenches finally to be obtained is relatively high, however, the above-described step (g) also may be followed by the repetition of the step (d) to step (g) one or two times. A method for manufacturing a semiconductor substrate for repeating the step (d) to the step (g) three times or more can reduce, even when an aspect ratio of trenches finally to be obtained is relatively high, an aspect ratio of the tranches for burying the epitaxial film in one time can be reduced. This can effectively prevent a void from being generated in the epitaxial film buried in the trenches.

INDUSTRIAL APPLICABILITY

The present invention can be used for a semiconductor substrate that is used for a semiconductor apparatus using a trench formed with a high aspect ratio in the depth direction of the substrate (e.g., a MOSFET and a super junction MOSFET having a three-dimensional structure) and the method for manufacturing thereof.

The invention claimed is:
1. A method for manufacturing a semiconductor substrate, comprising:
 preparing a substrate made of a single crystal semiconductor;
 forming a semiconductor layer made of a single crystal on the surface of the substrate;

arranging, on the semiconductor layer, a mask material having a device formation region and an alignment region of the semiconductor layer each including an opening;

etching the semiconductor layer, covered by the mask material, to simultaneously form an alignment mark formation trench in the alignment region and a device trench in the device formation region;

removing the mask material;

burying an epitaxial film in the device trench and partially filling the alignment mark formation trench with the epitaxial film simultaneously to form buried voids in the alignment mark formation trench; and subjecting a part of the epitaxial film that is formed outside of the device trench to a planarization processing.

2. The method for manufacturing a semiconductor substrate according to claim 1, wherein the alignment mark formation trench has a smaller width than a width of the device trench.

* * * * *